(12) United States Patent
Woodard et al.

(10) Patent No.: US 6,255,003 B1
(45) Date of Patent: Jul. 3, 2001

(54) GOLD-CLAD-SILVER-LAYER-CONTAINING FILMS

(75) Inventors: Floyd E. Woodard, Los altos, CA (US); Jerome W. Knapczyk, Springfield, MA (US)

(73) Assignee: Southwall Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/845,395

(22) Filed: Apr. 25, 1997

Related U.S. Application Data

(63) Continuation of application No. 08/486,582, filed on Jul. 6, 1995, now abandoned, which is a continuation of application No. 08/032,472, filed on Jul. 23, 1993, now abandoned.

(51) Int. Cl.[7] .................................................... B32B 15/08
(52) U.S. Cl. .......................... 428/623; 428/626; 428/434; 428/458
(58) Field of Search .................................... 428/672, 673, 428/621, 622, 623, 626, 630, 631, 632, 633, 434, 458; 359/585; 204/192.29

(56) References Cited

U.S. PATENT DOCUMENTS

| | | | |
|---|---|---|---|
| 4,091,172 | * | 5/1978 | Miller .................................... 428/672 |
| 4,234,654 | * | 11/1980 | Yatabe et al. ......................... 428/333 |
| 4,320,169 | * | 3/1982 | Yatabe et al. ......................... 428/672 |
| 4,413,877 | * | 11/1983 | Suzuki et al. ..................... 204/192.29 |
| 4,414,254 | * | 11/1983 | Iwata et al. ............................. 428/34 |
| 4,462,883 | * | 7/1984 | Hart ...................................... 428/621 |
| 4,548,691 | * | 10/1985 | Dietrich et al. ................. 204/192.29 |
| 4,565,719 | * | 1/1986 | Phillips et al. ......................... 428/34 |
| 4,857,094 | * | 8/1989 | Grota et al. ........................... 65/60.2 |
| 4,976,505 | * | 12/1990 | Cassidy et al. ................... 350/96.15 |
| 5,071,206 | * | 12/1991 | Hood et al. ..................... 204/192.97 |

FOREIGN PATENT DOCUMENTS 48-22264 * 7/1973 (JP).

OTHER PUBLICATIONS

Hansen, M., "Constitution of Binary Alloys", Second Ed., McGraw–Hill Book, Company, NY, 1958, pp. 5–7, (No Month).*

* cited by examiner

*Primary Examiner*—John J. Zimmerman
(74) *Attorney, Agent, or Firm*—Burns, Doane, Swecker & Mathis, LLP

(57) ABSTRACT

Heat wave-reflective or electrically conductive substantially transparent sheets, such as glazing sheets, which include a transparent solid substrate and one or more sequential transparent gold-clad silver layers supported by the substrate are disclosed. These sheets have superior corrosion resistance to equivalent sheets made without the gold cladding or made with gold/silver alloys. Sputter-deposit methods for producing these sheets are also disclosed.

16 Claims, 13 Drawing Sheets

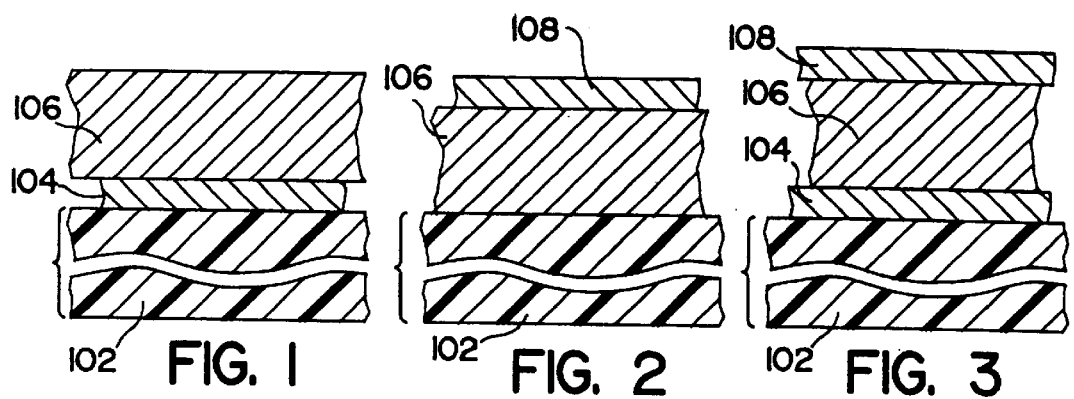
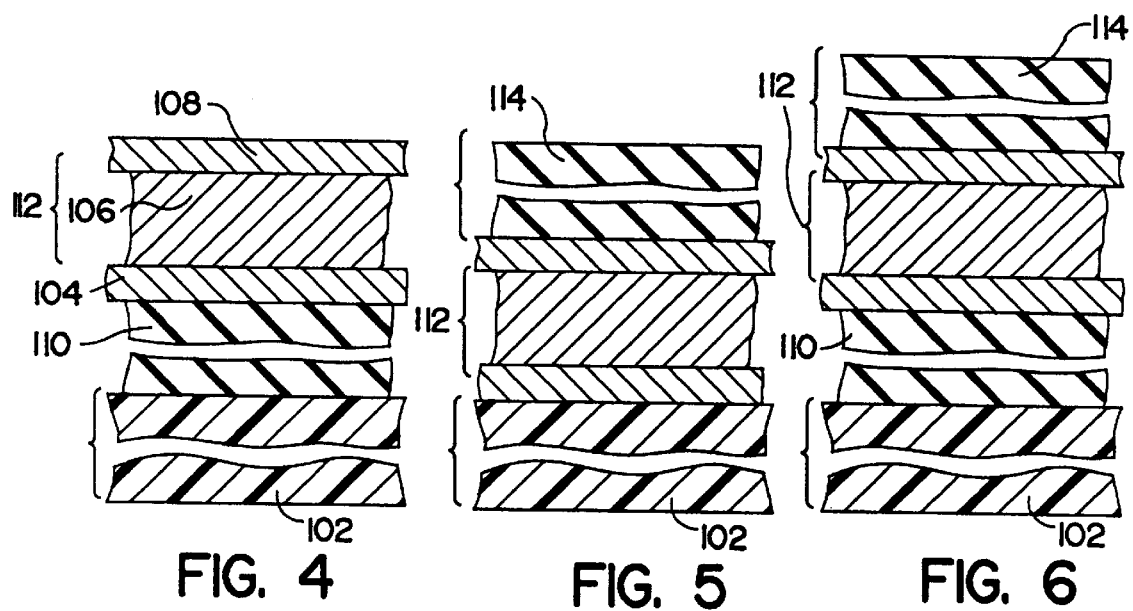
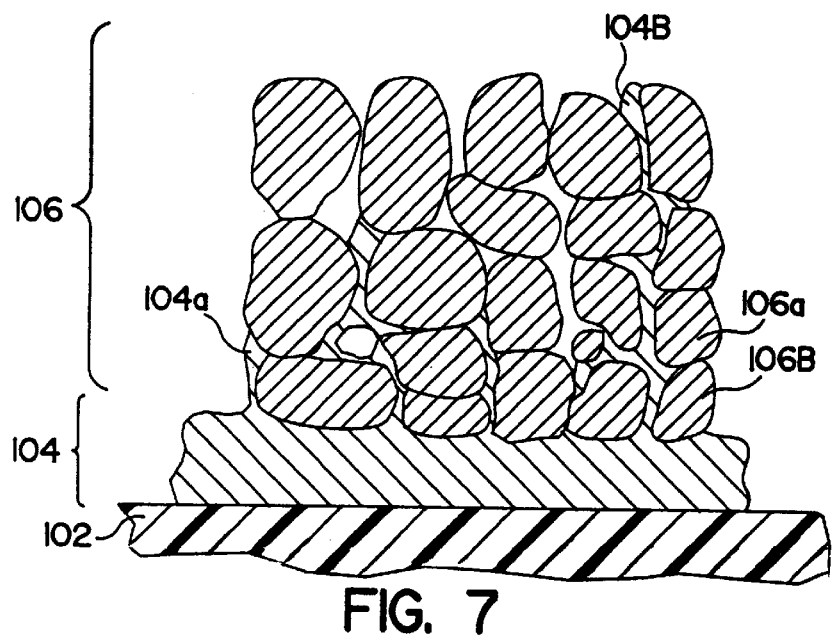

GOLD-CLAD-SILVER-LAYER-CONTAINING FILMS

This application is a continuation of application Ser. No. 08/486,582, filed Jul. 6, 1995 now abandoned as a continuation of application Ser. No. 08/032,472, filed on Mar. 23, 1993 and now abandoned.

BACKGROUND OF THE INVENTION

1. Field of the Invention

This invention relates to metal-layer-containing glazing films. More particularly it relates to improvements in heat-reflecting electrically conductive, substantially transparent metal-layer films for incorporation into glazing structures and other applications and to their preparation.

2. Background Information

A range of metal-layer-containing, light-transmitting structures have been proposed. These structures typically include a transparent support carrying one or more metal layers which are thin enough (10–1000 Å, for example) to permit transmission of a substantial fraction of the light shown upon them. These materials present a range of additional properties which have led to commercial applications. For example, the transparent metal layers tend to preferentially reject (reflect and/or absorb) longer wavelength radiation. This has led to glazing materials for architectural and automotive applications which preferentially pass visible light and reject near infrared radiation.

The metal layers in these materials are also electrically conductive. This property has given rise to glazing structures with in situ electrical resistance heating, to glazing structures capable of providing EMF shielding and transparent materials which can be incorporated into electrical and electronic devices such as transparent antistatic layers, transparent membrane switches, photoconductive devices, electroluminescent structures and photosensitive materials and the like.

In some embodiments these metal films are accompanied by dielectric layers which alter the metal layer's optics such as to increase transmissivity, decrease reflectivity at certain wavelengths and the like.

The art-taught structures have a transparent substrate— usually either glass sheet or plastic sheet or film. The substrate carries the metal layer, or in some cases multiple metal layers, and the optional dielectric layers. In some applications, these structures are used as is. In other applications, they are incorporated into more complex glazing systems by lamination or suspension.

Silver is a preferred metal in these structures because of its optical properties, good conductivity and relatively moderate price as compared to noble metals such as gold or platinum. One shortcoming of silver is its substantial chemical reactivity, particularly in the presence of environmental chlorine or sulfur. This reactivity leads to environmental oxidation (corrosion) which manifests itself as decreases in conductivity and transmissivity and as breakdowns in the structural integrity of the bonds between the various layers in the overall glazing material.

One approach to improving silver's stability used heretofore has been to apply transparent inorganic or organic hardcoat overlayers, such as silicon oxide or aluminum oxide overlayers, acrylate or polyolefin overlayers, or the like. Another approach involves complete mixing or alloying (on an atomic scale) of silver with gold or with other inert metals. U.S. Pat. No. 4,234,654 is an example of this approach. While alloying silver offers advantages, it has limitations. For one, when the alloyed silver layer is applied by sputter depositing or another vacuum-deposit method, only a set ratio of silver to the alloying metal, which is dictated by the appropriate composition of the metal source, can be achieved. To alter the ratio requires constructing a new source and reequipping the sputtering or other vacuum-depositing machine with it. For another, although the atomic mixing approach affords a good measure of corrosion resistance, this stability is obtained at the expense of increased visible absorption and increased electrical resistance. This is due to the interruption of the silver lattice structure by "foreign" gold atoms. The chemical stabilization scheme we have discovered achieves chemical inertness with smaller increases in visible absorption and sheet resistivity.

Another patent addressing silver's instability is U.S. Pat. No. 4,565,719 to Optical Coating Laboratories, Inc. which teaches "flash coating" the silver with palladium. While some degree of corrosion protection is afforded by this approach, the inherent absorption and blue coloration of pallidium makes it unacceptable in applications where high visible transparency is desired.

STATEMENT OF THE INVENTION

It has now been found that the stability and durability and longevity of metallic silver layers present in heat-reflective or electrically-conductive, substantially transparent glazing sheets can be substantially improved by bounding one side or both sides of the silver layer with a transparent gold cladding layer. This gold cladding layer can be metallic gold or an alloy containing at least 30% gold. The cladding layer or layers remain substantially as separate phases from the silver layer in the transparent glazing sheet.

In some embodiments of the invention, the gold-clad silver layer can be deposited as such upon a transparent solid substrate such as a sheet or film of plastic or a sheet of glass. In other embodiments, the gold-clad silver layer is accompanied in the optical product by one or more preceding or following layers of a dielectric having an index of refraction greater than about 1.75.

In another aspect, this invention provides a unique gold-clad silver layer structure in which the silver layer and the gold cladding are laid down as separate layers but in which a portion of the gold undergoes diffusion-induced grain boundary migration as a separate phase in the interstices among the grains of the silver layer.

In another aspect, this invention provides heat-reflecting, electrically conducting, substantially transparent glazing sheets which include one or more, such as two or three, of these silver layers, each with the one or two gold cladding layers of the invention, and with each of the gold-clad silver layers bounded on one or both sides by a dielectric layer, and this entire stack supported on a plastic or glass transparent substrate. These glazing sheets may additionally contain optional layers such as hardcoat layers and the like. These glazing sheets, in any of their embodiments, may be incorporated into a wide range of overall glazing systems, including laminated glass systems for automotive and architectural use, single-pane and multipane glazings, and, in the case of films, as suspended films in multipane glazing structures.

The products of this invention are most commonly prepared by the use of sputter-depositing. Accordingly, as another aspect, this invention provides processes for preparing improved heat-wave reflective or electrically conductive, substantially transparent glazing sheets using sputter-depositing. In these processes, a metallic silver layer is sputter-deposited onto a transparent substrate following or after the deposit of a layer of gold or gold alloy. In another embodiment, the metallic silver is sputter-deposited in between sputter-deposited layers of the gold or gold alloy.

As will be detailed below, in addition to improving the stability and corrosion resistance of the silver layer, the presence of one or more gold cladding layers surprisingly improves the conductivity and/or optical properties of the silver layer in certain cases.

DETAILED DESCRIPTION OF THE INVENTION

Brief Description of the Drawings

This invention will be further described with reference being made to the accompanying drawings, in which:

FIG. 1 is a schematic, not-to-scale, expanded-scale cross-section of a gold-clad-silver-layer-containing glazing product of this invention;

FIG. 2 is a similar view of another configuration of the product of this invention;

FIG. 3 is a similar view to FIG. 1 of a third configuration of the product of this invention, this configuration presenting a pair of gold cladding layers;

FIG. 4, FIG. 5 and FIG. 6 are cross-sectional, schematic, not-to-scale views of three embodiments of the product of this invention incorporating, in the case of FIGS. 4 and 5, a single dielectric layer, and in the case of FIG. 6, two dielectric layers with the gold-clad silver layer;

FIG. 7 is a very-much-expanded-scale view of a gold-clad silver product of the invention illustrating the phenomena of diffusion-induced grain boundary migration and its effect of causing a separate gold phase to migrate into a portion of the interstices of the granular silver layer;

Description of Preferred Embodiments

Definitions

Figure 8:
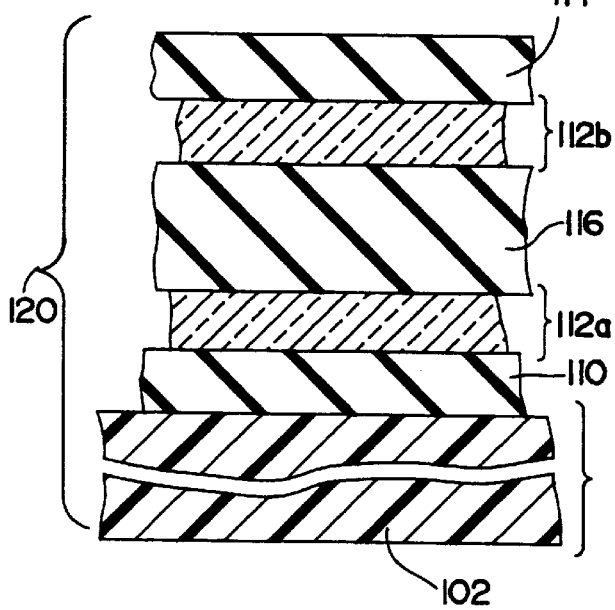
FIG. 8 is a cross-sectional, expanded-scale, not-to-scale cross-sectional view of an embodiment of the glazing material of this invention having two gold-clad silver layers bounded by and separated by dielectric layers.

As used in this specification and the appended claims the following terms have defined meanings:

"Visible radiation" or "light" means electromagnetic radiation having a wavelength of from 380 to 750 nanometers.

"Near infrared radiation" means electromagnetic radiation having a wavelength above 750 nanometers and less than 3000 nm.

"Transparent" means having the property of transmitting light. In some of the final products produced from materials containing the gold-clad silver layers of this invention it is desired to have a significant degree of shading. Accordingly, the term "transparent" does not imply complete transmission but rather any suitable level of light transmittance, for example an overall transmittance of light of at least about 15%, and especially at least about 20%. "Silver", when used to define the metal composition of a layer in the materials of this invention, means substantially pure silver, that is silver alloyed with not more than 1.5%, preferably not more that 0.5%, and especially not more than 0.25% (all by weight) of other metals.

"Gold", when used to define the metal composition of a layer in the materials of this invention, has a much broader meaning than does "silver." "Gold" means pure gold and also alloys of gold with silver and the like containing at least about 30% and preferably at least about 50% by weight gold. Pure gold and gold/silver alloys in these ranges are preferred.

A "gold-clad silver layer" is a silver layer having deposited on one or both of its surfaces a layer of gold, which layer of gold is preferentially on or about this surface and not uniformly distributed throughout the silver layer.

"Dielectrics" are nonmetallic materials which typically are transparent to light and near infrared radiation. Generally these materials are inorganic oxides but other materials such as inorganic sulfides and nitrides are also included.

A "spacer layer" is a dielectric layer located between two gold-clad silver layers.

A "boundary layer" is a dielectric layer that is not located between two gold-clad silver layers.

"Sputter-depositing" and "sputtering" and like terms refer to the process in which a layer of material is laid down upon a substrate by the use of a magnetron sputterer. This process will be explained in more detail, below.

"Electrical conductivity", "conductive" and like terms refer to the property of a material to carry an electrical current. When used to characterize the properties of a product of this invention, a "conductive" product is one having a sheet resistance of less than 30 ohms per square with preferred conductive materials having sheet resistances of from about 20 ohms to about 1 ohm per square.

Product Configurations

As illustrated in FIGS. 1, 2 and 3, in their most fundamental configurations, the products of this invention include a silver layer 106 clad on one or both sides with gold layers 104 and 108 and supported on a transparent substrate 102. As illustrated in FIGS. 4, 5, and 6, these products can further include one or more boundary layers of dielectric 110 and 114. As further illustrated in FIGS. 8 and 9, the products can have two or more of the gold-clad silver layers, 112 in their structure as 112a, 112b, etc. with the multiple gold-clad silver layers separated from one another by spacer layers 116, 116a, 116b, etc. These various elements will be discussed individually.

The Gold-Clad Silver Layer

The gold-clad sliver layer includes a separately sputter-deposited silver layer. The silver layer is at least about 40 Å thick and preferably is between 50 and 400 Å thick with a total thickness of the silver layer plus its cladding gold layers not exceeding 500 Å. These thickness values are further subject to the proviso that if multiple silver layers are present, their total thickness plus the total thickness of their gold cladding layers should not exceed about 500 Å. This 500 Å value is selected to assure that the product is transparent. Preferred silver layers are in the range of from about 60 Å to about 200 Å in thickness.

This silver layer is clad on one or both sides with separately deposited adherent layers of gold. The gold layers can have an effective thickness as thin as about one tenth of a full 3 Å thick monolayer of gold (defined for the sake of convenience as a 0.3 Å thick layer, even though it is not a continuous layer) and as thick as about 50 Å, again subject to the 500 Å total. Most commonly the gold layers are at the lower end of this range, such as from about 0.6 to about 30 Å in thickness, and especially from about 1 to about 10 Å in thickness. Pure gold (99% or greater atomic purity) is a preferred gold material but for cost reasons, alloys of 30% and especially 50% or greater gold with the remainder substantially silver are also very attractive. These gold cladding layers are applied by sputter-depositing techniques. In the embodiment shown in FIG. 1 the gold layer 104 is laid down first, in a sputter-depositing machine and then the silver layer 106 is sputterdeposited onto it. In the embodiment shown in FIG. 2 the steps are reversed with the silver being laid down first and the gold on top of it.

As will be seen in the Examples, the sputter-deposited silver and gold cladding layers are put down as separate layers and can be demonstrated not to be uniformly mixed together in the products. That having been said, the experiments conducted in the development of this invention demonstrated that some amount of gold finds its way into the silver layer, as well. One explanation of this finding might be that since sputtering is an energy-intensive process, the depositing of the gold onto the silver or vice-versa leads to a complete atomic mixing of the two mutually soluble elements and the formation of a homogeneous solid solution.

Experiments demonstrate that this is not happening. For one, these layers are extremely thin, in the case of a 3 Å gold layer, about 1 atom thick and in the case of a 70 Å silver layer maybe 20 atoms thick. If fusing and metal/metal solution forming occurred it would be presumed that this would lead to an essentially uniform composition across layers this thin. In fact physical examination shows that the layer compositions are clearly not uniform.

In addition, if a solution was being formed there should be no difference between the resulting layers and layers formed by directly sputtering from an alloy target onto the surface. In fact the performance of the present gold-clad silver layers is significantly different than (and superior to) the performance observed with alloy based layers.

Moreover, corrosion resistance afforded by a given amount of gold can be maximized by distributing the gold on both faces of the silver as opposed to distributing it in other manners.

Based on these findings, it has been deduced that the presence of gold in the silver layer can be explained as the result of diffusion-induced grain boundary migration of the gold into the silver phase. This phenomena is described in *Diffusion Phenomena in Thin Films and Microelectronic Materials*, Devendra Gupta and Paul S. Ho, editors, Noyes Publications, Park Ridge, N.J., in chapter 5, "Diffusion-Induced Grain Boundary Migration in Thin Films" and in the article by J. C. M. Hwang, et al. appearing at pages 1349–59 of the March 1973 issue of *J. Appl. Phys*,50,(3). With this process a separate gold-enriched phase migrates into a portion of the interstices between silver granules in the silver layer. This migration into the silver layer is not uniform and tends to be most pronounced in the regions adjacent to the layer boundaries. FIG. 7 is a visualization of the product which results from this process. In this product there is a substrate 102. Sputter-deposited onto the substrate is a gold layer 104. On top of the gold layer is a silver layer 106 made up of silver granules 106a, 106b, etc. While this is a continuous silver layer in a macro sense, there are, however, interstices between the various grains. Gold 104 migrates as a separate phase into some of these interstices as indicated by 104a, 104b, etc. As is illustrated in this figure, the fraction of gold phase is highest nearest to the gold-silver layer boundary.

Figure 19:
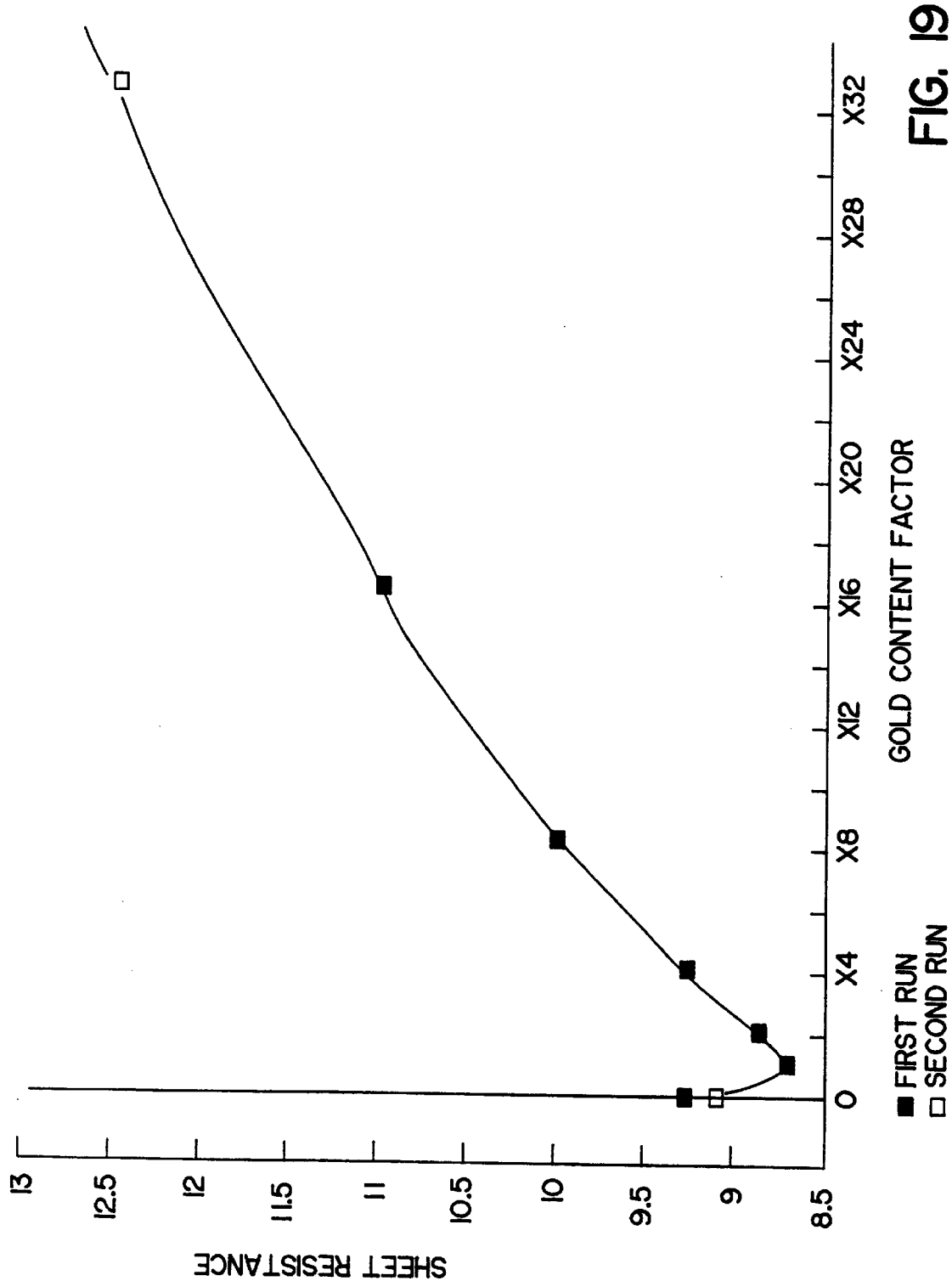
FIG. 19 is a graph illustrating the unexpected finding that gold-cladding the silver layer increases electrical conductivity of the resulting glazing materials.

As previously noted, the silver layer may be clad on either side or on both sides. To recall, an important reason for going to the trouble and expense of cladding was its enhancement of corrosion resistance and the like. As a general rule, we have obtained best results when both sides of the silver layer are clad. However, the improvement seen with a single cladding layer has been very good. One interesting finding which was made during the testing of these materials was that in generally a single cladding layer below the silver layer is, if anything, superior to a single layer above the silver layer. ("Above" and "below" are determined with the substrate being "at the bottom" of the stack.) This was somewhat unexpected since one would assume that the path of corrosive attack would be from above and one would assume that the top cladding layer would play a more important role in fending it off. Another unexpected advantage of placing the gold cladding exclusively under the silver layer is the finding that this configuration leads to lower sheet resistivity and lower visible absorption as shown in FIG. 19.

Figure 9:
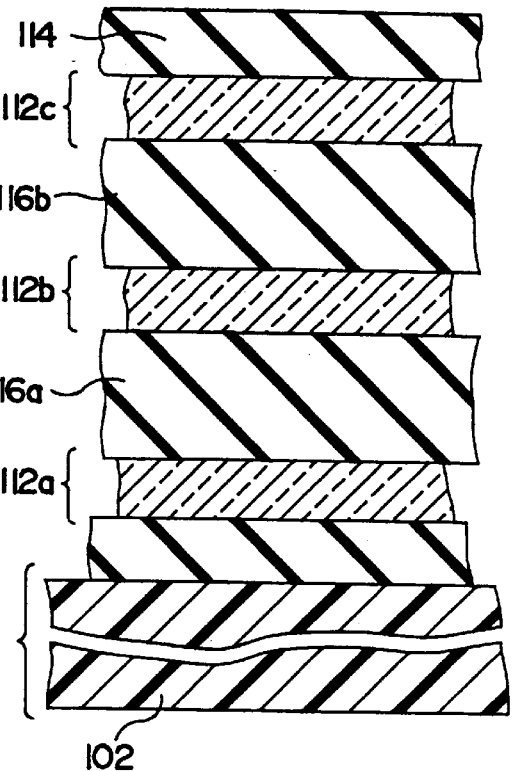
FIG. 9 is similar to FIG. 8 but of a glazing material having three gold clad silver layers.
Figure 10:
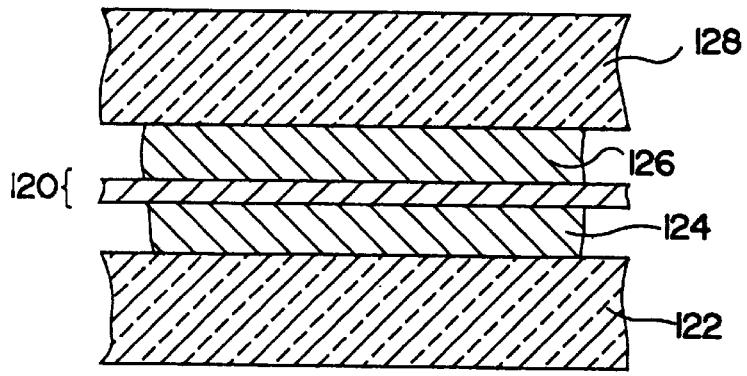
FIG. 10 is a cross-sectional view of a window glazing incorporating a clad silver-layer-containing material, such as the material shown in FIGS. 4, 5, 6, 8 or 9 laminated between two sheets of glass.

As will be seen with reference to FIGS. 8 and 9, two or more gold-clad silver layers, each separated from one another by a spacer layer can be employed. In theory, there is no limit to the number of gold-clad silver layers that can be used in these materials. In practice, however, one to five such layers are preferred with two or three gold-clad silver layers being more preferred. If more than one silver layer is present, the best corrosion resistance is obtained when each layer is gold clad.

In FIGS. 8 and 9 the two or three transparent metal layers are depicted as of equal thickness. This is not a requirement of the present invention but is often preferred for ease of fabrication. Because the transparent metals are sputter-deposited, the thickness of the deposits is a function of the sputtering conditions. If, as is usually most convenient and thus preferred, the conditions are held constant, the thicknesses of the layers will be constant.

Dielectric Layers

The products of this invention optionally, but preferably, include one or more boundary layers. In addition, when the products have two or more gold-clad silver layers, they include one or more spacer layers. These boundary and spacer layers are composed of one or more dielectrics.

The material shown in FIG. 6 is depicted with two boundary layers 110 and 114. These layers provide physical protection to the gold-clad silver layer 112 beneath them and may also serve to reduce visual reflections off of the metal surface to which they are contiguous. It is often advantageous to have a symmetric sandwich with boundary layers on both sides of the gold-clad silver layer.

However, if desired, one or both of the boundary layers can be omitted. This is shown in FIGS. 4 and 5. The boundary layers can be the same or different dielectric and can be identical to or different than the dielectric making up the spacers.

The thicknesses of the boundary layers range from about 100 Å to about 1500 Å. Boundary layers are preferably from about 150 Å to about 900 Å and especially from about 200 Å to about 700 Å in thickness.

As shown in FIGS. 8 and 9, multiple gold-clad silver layers can be employed separated by spacer layers. In FIGS. 8 and 9 spacer layers 116. 116a and 116b are each between about 400 Å and about 2000 Å in thickness. The preferred thicknesses selected within this range may depend upon the index of refraction of the dielectric employed. Spacer layers are preferably from about 450 Å to 1100 Å and especially from about 500 to 1000 Å in thickness.

The boundary layers and spacer layers are made from dielectric materials having an index of refraction of from about 1.75 to about 2.25. Materials having an index of refraction within this range include the inorganic dielectrics such as metallic and semimetallic oxides, for example indium oxide, tin oxide, titanium dioxide, bismuth oxide, chromium oxide, as well as other inorganic metal compounds, for example zinc sulfide and magnesium fluoride and mixtures thereof. Of these materials, preference is given to indium oxide, tin oxide and mixtures thereof and titanium dioxide.

The dielectrics can be conveniently deposited by reactive sputtering techniques, although, if desired, chemical deposition and vapor deposition methods can be employed to apply the dielectric layers.

The Transparent Substrate

In each of FIGS. 1 through 10, the gold-clad silver layer (e.g., 112) is shown adhered to and supported by a transparent support 102. This support is shown in section because it is many times as thick as the filter. This thick support is essential to the practice of this invention. The filter itself is at most only a few hundred nanometers thick and thus can have only minimal physical strength without the added support. Support 102 can be selected from among the rigid and nonrigid but minimally stretchable transparent solids which can withstand the conditions of sputter deposition. Glass, both plate glass and laminated glass, and rigid plastics, such as ply(carbonate) and poly(acrylate) in thicknesses from about 50 mils to about 5 cm or more are representative examples of rigid supports. Poly(ester)s including poly(ethyleneterephthalate) and other terephthalate ester polymers, poly(urethanes), cellulose ester polymers, acrylic polymers, and poly(vinyl fluoride)s from about 1 or 2 mils to about 50 mils in thickness are representative examples of nonrigid, minimally stretchable films which may be employed. Poly(esters) and in particular poly(ethylene terephthalates) such as the DuPont "Mylars" are a preferred group of film supports.

Optional Layers

Although not really a part of this invention, the gold-clad silver-layer-containing products of this invention can contain a range of additional layers, such as hardcoats, adhesives, slip layers and the like to facilitate their incorporation into durable window products, laminated window products, electronic products and the like.

Preparation Methods

Figure 21:
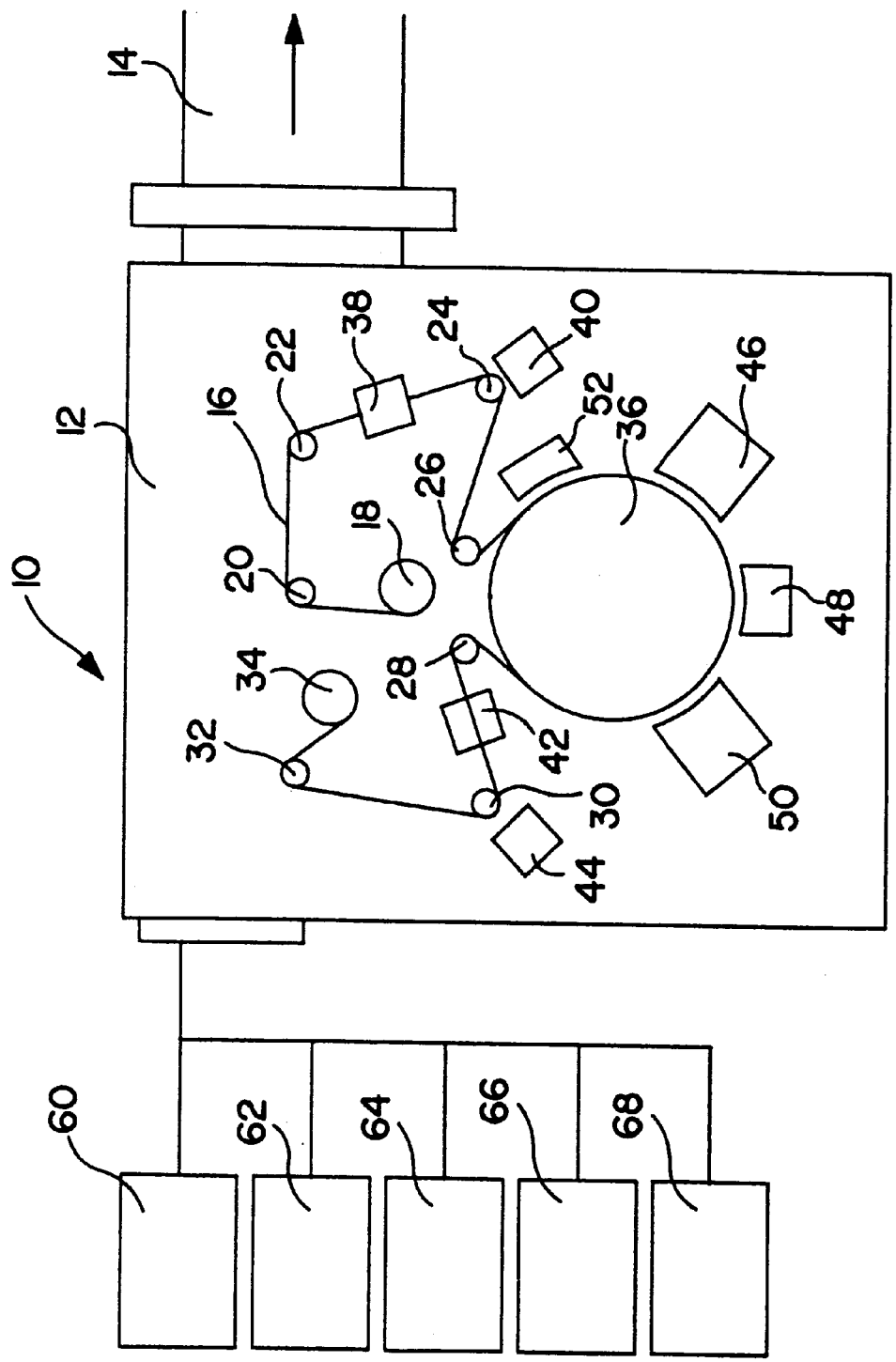
FIG. 21 is a schematic diagram of one type of sputter-deposit apparatus which may be used to produce the materials of this invention.

The gold-clad silver layers and optional dielectric layers are directly adhered to the support. This can be carried out by sequentially applying the various layers directly to the support by first sputter-depositing a boundary layer, then a gold cladding layer, a silver layer, a gold cladding layer, a spacer layer, etc. FIG. 21 depicts one form of sputterer which may be used to lay down such layers one at a time or, by using multiple sputtering stations, two or more essentially simultaneously in sequence. FIG. 21 shows a continuous web coating sputtering system 10 suitable for laying down these various layers. System 10 includes vacuum chamber 12 which is evacuated via line 14. Contained within chamber 12 is a drive mechanism for moving a sheet of flexible polymer film 16 past a series of magnetron sputtering stations 50, 48, and 46. The drive mechanism includes feed roll 18, idlers 20, 22, 24, 26, 28, 30 and 32 and take-up roll 34.

The film passes around chilled idler drum 36 as well. The film passes a pair of monitors for determining its transmittance, 38, and reflectance, 40, before coating and a similar pair of monitors 42 and 44 after coating. This coater is configured to simultaneously sputter-deposit up to three layers on the plastic film using three separate DC magnetron cathodes 46, 48 and 50. Typically, cathode 46 could be used to lay down the a gold cladding layer. Cathode 48 can be used to lay down the silver layer. Cathode 50 can be used to lay down a second gold cladding layer if desired to generate such a three part clad layer in a single pass. Also located in the system is a pre-glow station 52 for optional ionized gas cleaning or surface energy adjustment of the plastic film before coating. Each of these four stations is isolated from each other in space as a minichamber (see U.S. Pat. No. 4,298,444), thereby producing a local environment for the containment of the various plasma gasses. This allows separate processes to be carried out simultaneously at each station with variations in atmosphere from station to station but with minimal cross-contamination among the four sources. As will be understood by those familiar with the art of sputtering, if a dielectric boundary or spacer layer is called for it can be laid down using an appropriate metal cathode and a reactive gas such as oxygen so as to "reactively sputter-deposit" the desired dielectric directly onto the surface.

The control and monitoring of the sputtering system are normally accomplished using equipment and sensors which are common in machines of this type. These are shown in FIG. 19 and include: 1) mass flow controllers (MKS) for regulation of gas flow into the cathode minichambers; 2) 5–10 kilowatt DC power supplies (Advanced Energy) for the three sputtering cathodes; 3) an optical monitoring system (Hexatron/Southwall Technologies) which measures both reflectance and transmission of the film over the spectral region from 360 to 2000 nm; and 4) a film motion control system (Drivex) which regulates the tension, speed, and distance of the film as it moves through the system.

Test Methods

The products of this invention are tested by a variety of conventional methods. In addition they are subjected to several less common tests. For example, many products are subjected to XPS (X-Ray Photoelectron Spectroscopy) with ion etching depth profiling. This is a method whereby a sample is gradually attacked by a sputtering argon beam so as to gradually remove atomthick layers of material. As this material is removed the chemical make-up of the bottom of the pit is determined by measuring the kinetic energy of electrons released from the sample due to X-ray bombardment. Thus an accurate picture of the cross-sectional make-up of the sample is obtained.

Another test of interest is a "salt fog" corrosion test. This test is described at ASTM B117. Samples are placed in a salt fog chamber operated at 95° and 95% relative humidity. Periodically samples are removed and either visually inspected for corrosion or tested for their optical or electrical characteristics to determine evidence of relative stability.

EXAMPLES

This invention will be further described with reference being made to the following Examples. These are provided to illustrate the practice of the present invention and are not to be construed as limiting its scope.

Example 1

A series of silver-on-polyethyleneterephthalate films were prepared using the general sputter-depositing preparation process described above. The PET was 2 mil thick AH4400. The first layer in all members of the series was an unchanging boundary layer of indium oxide. Over this boundary layer was deposited a constant thickness (about 100 Å) layer of silver. In a control run, no gold cladding was added. In five other members of the series, gold cladding was added on top and beneath the silver layer. The amounts of gold in each cladding layer was varied from 1 unit (estimated to be about one fifth to one tenth of a three angstrom monolayer of gold or about 0.3–0.6 Å) to 2 units (X2), to 4 units (X4), to 8 units (X8) and to 16 units (X16). These X2, X4 factors were based on controlling the sputtering conditions in various multiplicative ways which were held constant from experiment to experiment to provide valid bases of comparison. However the actual thicknesses of gold added did not necessarily increase in a geometric manner as this experiment might suggest. It is estimated from weights of silver and gold employed that the X16 material had about a full 3–4 Å thick monolayer of gold in each cladding layer.

The varied gold thicknesses were obtained as follows: A gold thickness of X16 was obtained by sputtering a narrow gold cathode through a 3/16" slit at a power of 0.8 kW and a linespeed of 72.9 mm/second. Thinner gold layers were obtained by reducing the power to the cathode (i.e. down to 0.05 kW to obtain a X1 gold thickness).

For all these samples the deposition of silver was held constant at 0.54 kW at a linespeed of 9.5 mm/sec using a ¾" slit.

In all of these samples, a boundary layer of indium oxide was deposited over the gold-clad silver layer.

As a shorthand nomenclature, this type of sample was referred to as a "PET/IO/Au/Ag/Au/IO" material, with the various elements having their regular meaning, PET identifying the substrate and IO identifying the indium oxide dielectric. An individual sample in the series was referred to as a "PET/IO/AuX16/Ag/AuX16/IO" and the like.

A more detailed preparation of a representative material is as follows:

The process and product of this invention were demonstrated in a laboratory scale run denominated LC1-Nb21-Pg71-Ex5. This sample consisted of the following coating: indium oxide/goldx16/silver/goldx16/ indium oxide. Each layer was deposited in a separate pass through the sputtering machine shown in FIG. 21. After each pass, the substrate was backed up to the starting point without breaking vacuum.

A roll of 5 mil thick PET (American Hoeschst 4400) was loaded into the sputtering machine with the non-slip or untreated side of the roll facing the sputtering targets. A gold target (5"×15.625" covered with a 0.188" slit) was placed into the position marked 46 in FIG. 21. A silver target (50"×15.625" covered with a 0.75" slit) was placed into position 48. An indium target (5"×15.625" covered with a 3.5" uniformity shield) was placed into position 50.

During the first pass the polymeric film was advanced at 9.5 mm/sec and only the dc glow and indium target were used. After pumping down to $2 \times 10^{-5}$ Torr, an air flow of 12.4 sccm was introduced in the dc glow chamber (position 52 in FIG. 21) to obtain a pressure of $1.0 \times 10^{-2}$ Torr. The glow was powered with a dc voltage of 1500 V to obtain a current of 30 mA. Indium oxide was deposited using a reactive dc magnetron process. A pressure of $4.1 \times 10^{31\ 3}$ Torr was obtained when the following gases were introduced into the indium chamber: 34 sccm oxygen, 14 sccm hydrogen, 4 sccm argon and 5.5 sccm of nitrogen.

During the second pass the polymeric film was advanced at 72.9 mm/sec and only the gold target was powered. A pressure of $3.0 \times 10^{-3}$ Torr was obtained using an argon gas flow of 20.1 sccm. The voltage applied to the target was 566 volts to obtain a current of 1.4 Amps (i.e. ~0.8 kw). This gave a gold coating thickness which is referred to as X16 in the experiments considered here.

During the third pass the substrate was advanced at 9.5 mm/sec and only the silver target was powered. A pressure of $3.0 \times 10^{-3}$ Torr was obtained using an argon gas flow of 17.2 sccm. The voltage applied to the target was 486 volts to obtain a current of 1.07 Amps.

During the fourth pass the coated substrate was advanced at 72.9 mm/sec and only the gold target was powered. A pressure of $3.0 \times 10^{-3}$ Torr was obtained using an argon gas flow of 20.1 sccm. The voltage applied to the target was 563 volts to obtain a current of 1.4 Amps. This gave a gold coating thickness which is referred to as X16 in the experiments considered here.

During the fifth pass the polymeric film was advanced at 9.5 mm/sec and only the indium target were used to deposit indium oxide. A pressure of $4.6 \times 10^{-3}$ Torr was obtained when the following gases were introduced into the indium chamber: 39.6 sccm oxygen, 31 sccm hydrogen, 4 sccm argon and 5.5 sccm of nitrogen. A voltage of 316 V was applied to the indium cathode to obtain a current of 17.38 Amps.

Example 2

Following the methods and the nomenclature of Example 1 a "PET/IO/AuX16/Ag/AuX16" material was prepared.

This sample was prepared for XPS analysis. The bottom and top Au thicknesses were X16 as obtained by sputtering at 0.4 kW through a 3/16" slit at a linespeed of 36 mm/sec.

The deposition of silver was held constant at 0.56 kW at a linespeed of 9.50 mm/sec using a ¾" slit. Power/Linespeed=58.9 W sec/mm.

The sample was prepared on 5 mil American Hoeschst 4400.

Example 3

Following the methods and the nomenclature of Example 1 a "PET/ITO-50/AuX32/Ag" material, where ITO-50 is a 50/50 indium-tin oxide, was prepared.

This sample was prepared for XPS analysis. The bottom Au thickness was X32 and was obtained by sputtering at 0.4 kW through a 3/16" slit at a linespeed of 18 mm/sec.

The deposition of silver was held constant at 0.54 kW at a linespeed of 9.50 mm/sec using a ¾" slit. Power/Linespeed=56.8 W sec/mm.

The sample was prepared on 5 mil AH4400.

Example 4

Following the methods and the nomenclature of Example 1 a "PET/IO/AuX16/Ag/AuX16/Ag/AuX16/IO" material was prepared.

Au thickness was X16. An Au thickness of X16 was obtained by sputtering a narrow Au cathode through a ³⁄₁₆" slit at a power of 0.8 kW and a linespeed of 72.9 mm/sec.

The deposition of silver was held constant in both layers at 0.50 kW at a linespeed of 9.5 mm/sec using a ¾" slit. Power/Linespeed=52.6 W sec/mm.

This sample was all prepared on 2 mil AH4400.

Example 5

Following the methods and the nomenclature of Example 1 a series of "PET/IO/Au/Ag/Au/Ag/Au/Ag/Au/IO" materials were prepared.

Various thicknesses of Au cladding were used ranging from X1 through X32. This was achieved by varying the power to the Au targets. The linespeed was 42.6 mm/sec.

Example 6

Following the methods and the nomenclature of Example 1 a "PET/IO/15% Au/85% Ag Alloy/IO" material was prepared for purposes of comparison.

The 15% Au alloy thickness was that resulting from depositing the metal through a standard uniformity shield at a power of 0.275 kW (0.71A×388 V) at a linespeed of 6.45 mm/sec or a power to linespeed ratio of 42.7 W sec/mm.

The top indium oxide layer was obtained by sputtering at 5.5 kW at 6.45 mm/sec.

The sample in this series was prepared on 5 mil AH4400.

Example 7

The gold-clad silver layers of this invention can be applied directly to a rigid material such as glass, with or without dielectric boundary layers. Alternatively the gold-clad silver can be applied to a flexible plastic film and that film can be laminated into a rigid structure.

This second approach was demonstrated on a series of "PET/IO/Au/Ag/Au/IO/Au/Ag/Au/IO" films which were prepared as described in Example 4. In these films, the silver layers were 70–80 Å thick. The boundary layers were about 400 Å thick. The spacer layers were about 700 Å thick. The films were made with "X4", "X8", "X16", "X32" and "X44" gold layers. These correspond to 0.8, 1.5, 3, 6 and 8 Å thicknesses.

These films were laminated into glass-PVB film-PVB-glass glazing sheets.

Example 8

The production of Example 7 was repeated using the "three silver layer" films of Example 5, this gave size to five laminated glass-PVB-film-PVB-glass glazing sheets. These had "X4", "X8", "X16", "X32" and "X44" gold layers.

Sample Testing

The preceding Examples have illustrated a wide range of preparations. However, they are merely representative of numerous similar materials prepared following the invention's teachings.

The materials demonstrated in Examples 1–8 as well as some of these other similar materials whose preparation is not specifically described were subjected to a variety of tests, with the follow results:

XPS Test Results (FIGS. 11 and 12) A "PET/ITO-50/AuX32/Ag" material as shown in FIG. 1 and prepared as described in Example 3 was sent to a commercial testing laboratory for an XPS test. The results of the test are given in FIG. 11. This material, based on its preparation, had about 5–7 Å of gold deposited on top of ITO with about 60–70 Å of silver on top of the gold.

Figure 11:
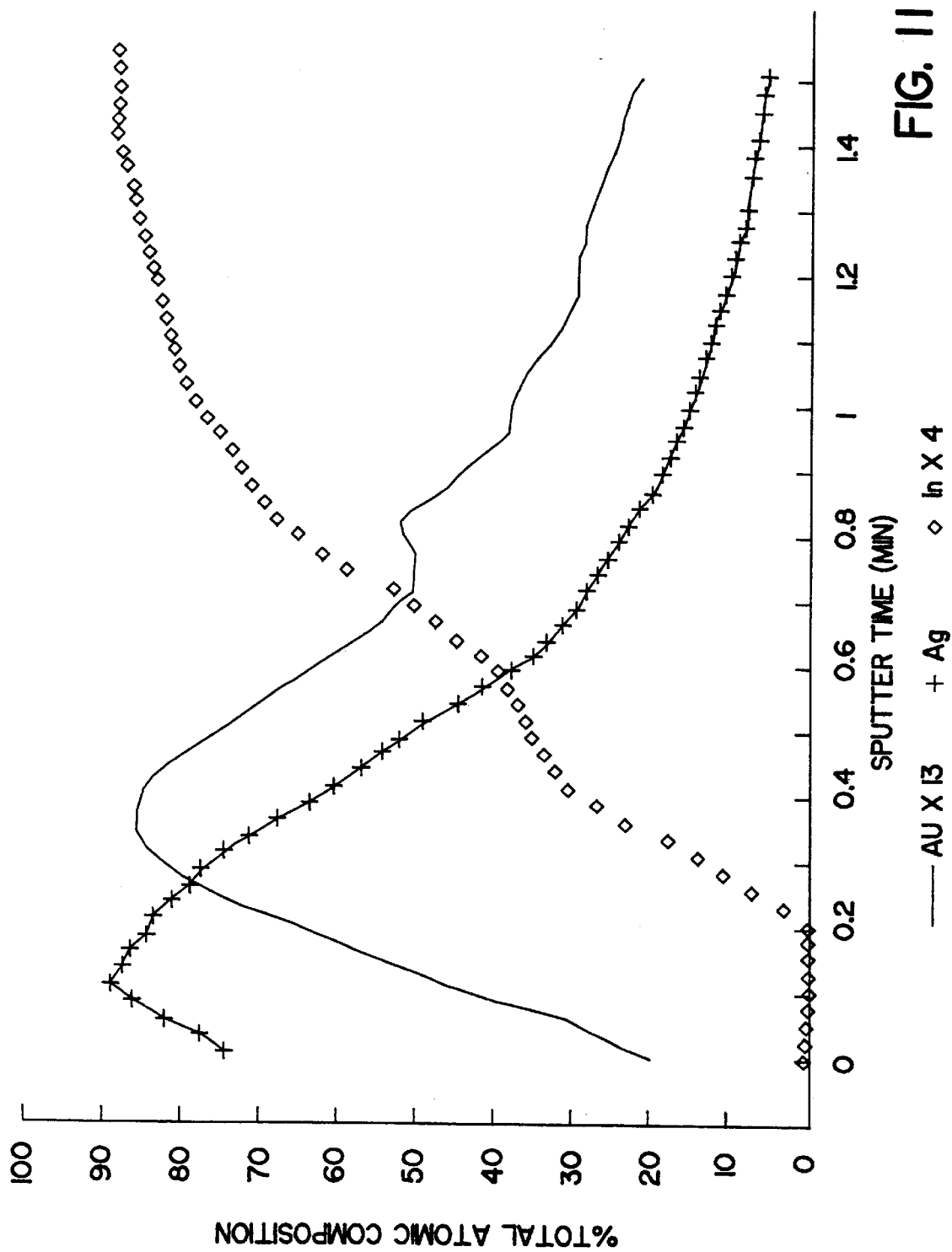
FIG. 11 is a graph resulting from an ESCA examination of a product of the invention illustrating the presence of gold-enriched and silver-enriched regions in a gold-clad silver layer product of this invention.

As FIG. 11 illustrates, at time=0 the argon beam began removing material. For the first 12 seconds, no ITO was reported in the removed material, but instead the material removed was almost entirely silver plus carbon and other surface contaminants not shown in FIG. 11 plus a rapidly increasing proportion of gold (from 0.5% increasing to about 2%). In the next 12 second, ITO began to appear. (It increased in proportion throughout the remainder of the test, eventually reaching 90% after about 80 second.) Also in the second 12 seconds, the predominance of silver began to drop and gold continued to climb. In the third 12 seconds of analysis, the gold and silver continued to drop, somewhat in parallel. This trend continued to the end of the test.

These results, showing an initial silver peak with low gold present, followed by a gold peak with silver decreasing with ITO initially not seen at all, illustrate a product in which the etching electron beam (looking from the outside or top layer down) initially saw a silver layer. As it moved through the silver layer, it found ever-increasing amounts of a gold-enriched phase. Then the beam began to "find" ITO and at the same time increasing amounts of gold. This shows that the gold layer is very thin, 1–2 atoms, but clearly not homogeneously mixed or alloyed with the silver.

Figure 12:
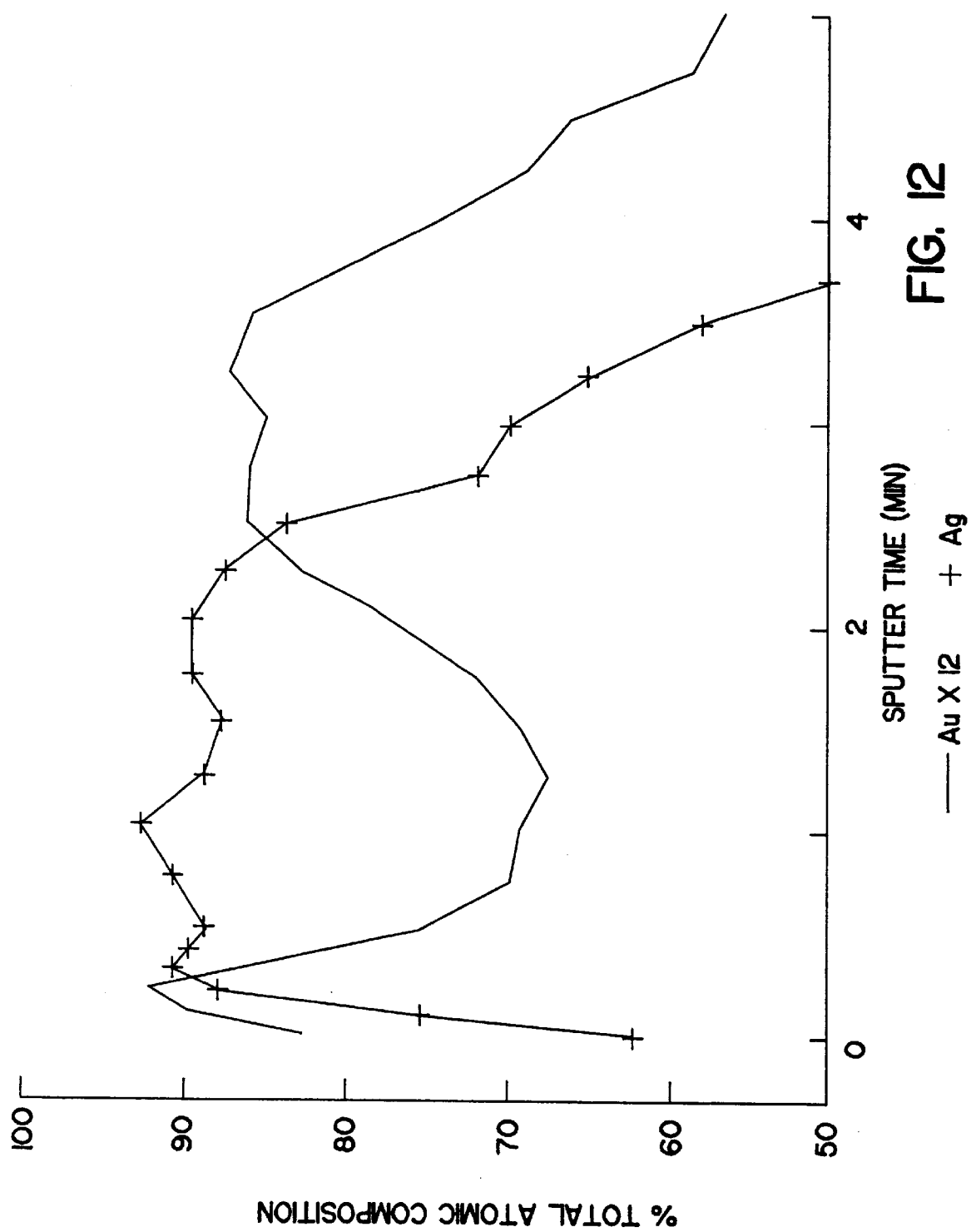
FIG. 12 is a graph of ESCA results obtained from another product of the invention having two gold layers bounding a single silver layer and illustrating the segregation of the gold and silver in this structure.

In FIG. 12 the XPS results for a "PET/ITO/AuX16/Ag/AuX16" material are given. As the ESCA beam begins etching away at the outer gold layer at time=0, a large fraction (relatively) of the material removed was gold. Silver content was low. Within the first 15 seconds, the bold level peaked and began to fall. The silver content was climbing. For nearly the next two minutes the silver content stayed high while the gold level dropped and then started to climb. After about 2 minutes, the silver content began to drop, indicating that the XPS beam had cut through the silver layer. The gold level rose at the same time. If ITO had been depicted on the graph, it would be increasing steeply in the 2–3 minute range.

Like the results given in FIG. 11, these results draw a picture of a product having very thin (2–3 Å) cladding layers of gold on top of and beneath a thicker silver layer. The gold is not present exclusively in the cladding layers but neither is it distributed evenly throughout the silver layer. It is preferentially substantially segregated at the outer surfaces of the silver layer with a fraction nonuniformly distributed into the silver layer.

Corrosion Test Results

Films

A group of four materials prepared in accord with the Examples were tested for corrosion resistance in the salt fog test. One of the four materials was a control having a 70–80 Å layer of silver between two indium oxide boundary layers (PET/IO/Ag/IO/ITO). The IO/ITO double outer boundary layer provides an extra measure of corrosion resistance during salt fog exposure. This, in and of itself, does not constitute an aspect of this invention.

The other three materials had identical amounts of gold (totalling about 6 Å) but the gold's placement was varied. These materials were "PET/IO/AuX16/Ag/AuX16/IO/ITO," "PET/IO/AuX32/Ag/IO/ITO, " n and "PET/IO/Ag/AuX32/IO/ITO."

The materials were placed in the salt fog chamber. They were removed periodically and their sheet resistances were measured. (A non-corroded silver surface has higher conductance and lower resistance than a corroded surface. Resistance increases as a function of the extent of corrosion.)

Figure 13:
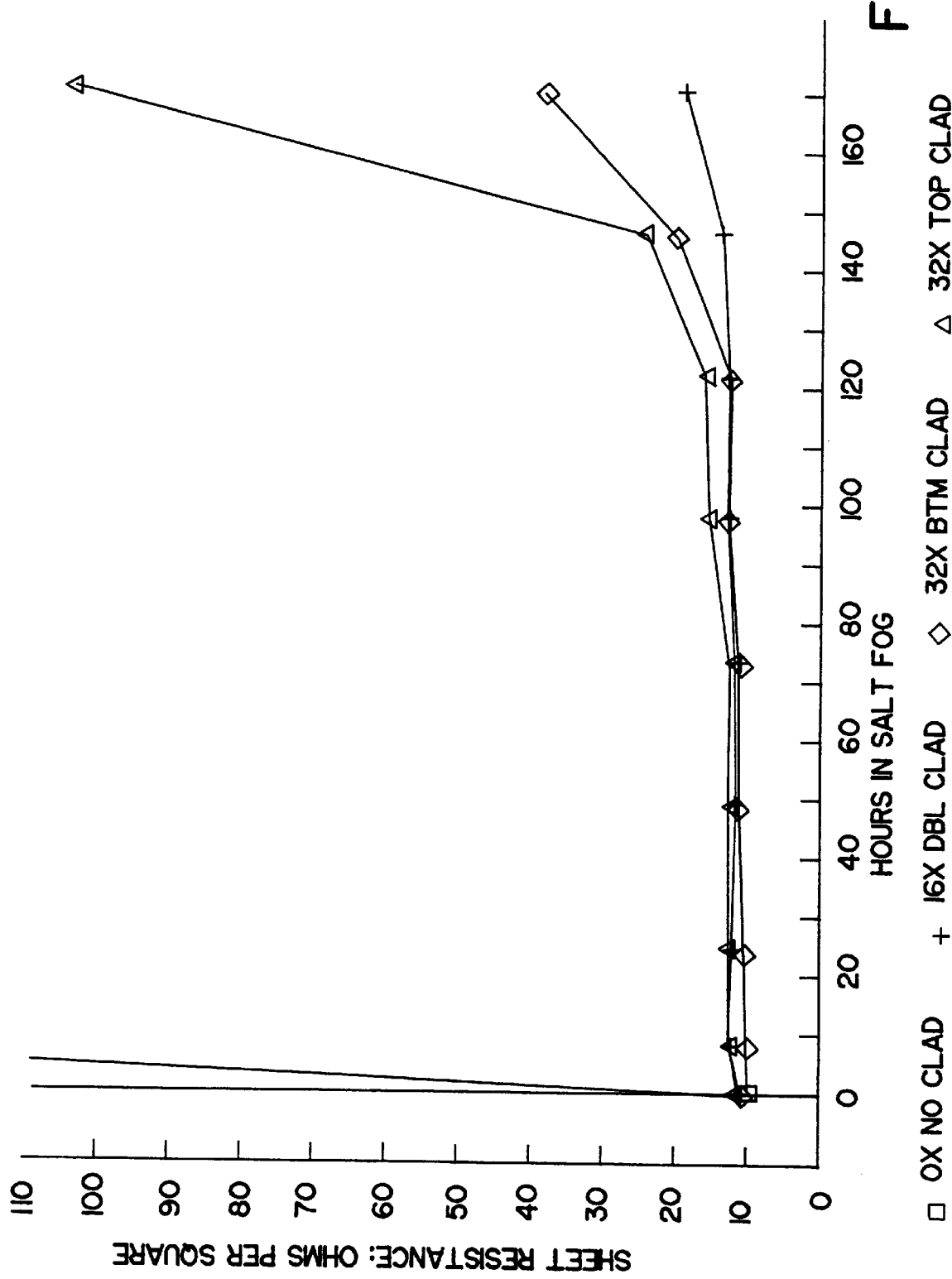
FIGS. 13, 14, 15 and 16 are four series of graphs illustrating the beneficial effects of the gold cladding on delaying the corrosion of silver layers.

The results of the resistance measurements are given in FIG. 13. It can be seen that the control material corroded in a matter of a few hours. In the first 120 hours, the three test materials gave similar performance. Shortly thereafter, the "top clad" material began to show evidence of corrosion. The "bottom clad" material was next to go and the "double clad" material was the most stable. The superior effectiveness of an "underlayer" (bottom clad) at protecting the silver layer from "top surface" corrosion attack, as compared to a "top clad" material was unexpected.

Figure 14:
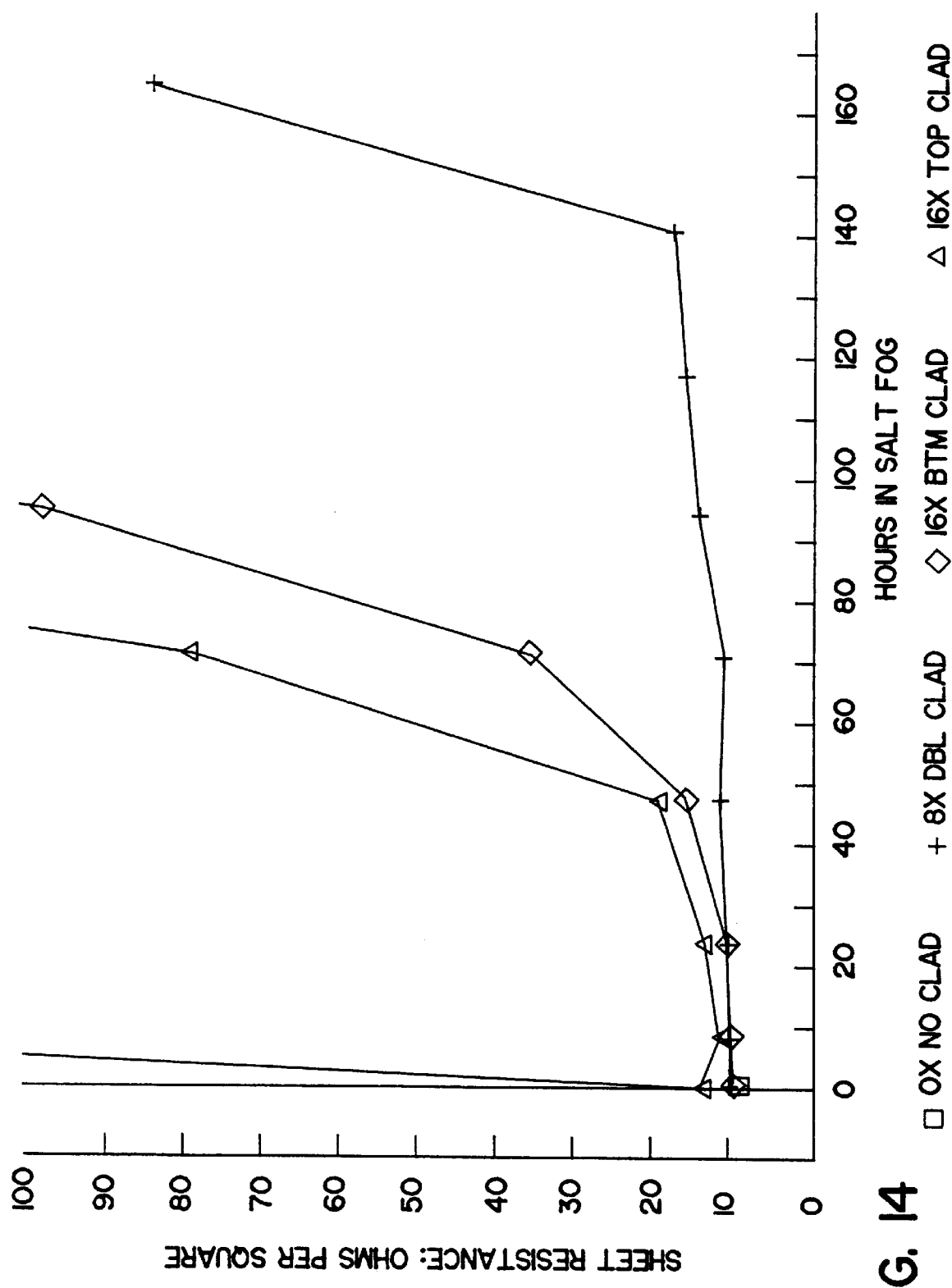

In FIG. 14 a similar set of test results are presented for a control and a set of test materials having half the total gold of the materials tested as shown in FIG. 13. These materials were "PET/IO/AuX8/Ag/AuX8/IO/ITO," "PET/IO/AuX16/Ag/IO/ITO," and "PET/IO/Ag/AuX16/IO/ITO."

Results similar to those shown in FIG. 13 were obtained. The AuX16 loading was not as effective as the AuX32 loading. The same order of failure was noted—overlayer first to fail—double layer last to fail.

These results show that with a 2 atom thick gold layer (AuX32) or with a 1 atom thick amount of gold (AuX16), the location of the gold varies the degree of corrosion resistance imparted to the silver layer. This is additional evidence that the gold substantially stays put and does not uniformly distribute (alloy) through the silver phase.

Comparing the results shown in FIG. 13 and the results shown in FIG. 14 it can be seen that when thinner gold clads are used, i.e. substantially less than a full monolayer (FIG. 14), there is a more striking advantage to depositing the gold equally on both surfaces. While treating both surfaces is superior at high gold loadings the advantage is less pronounced.

Laminates

Figure 15:
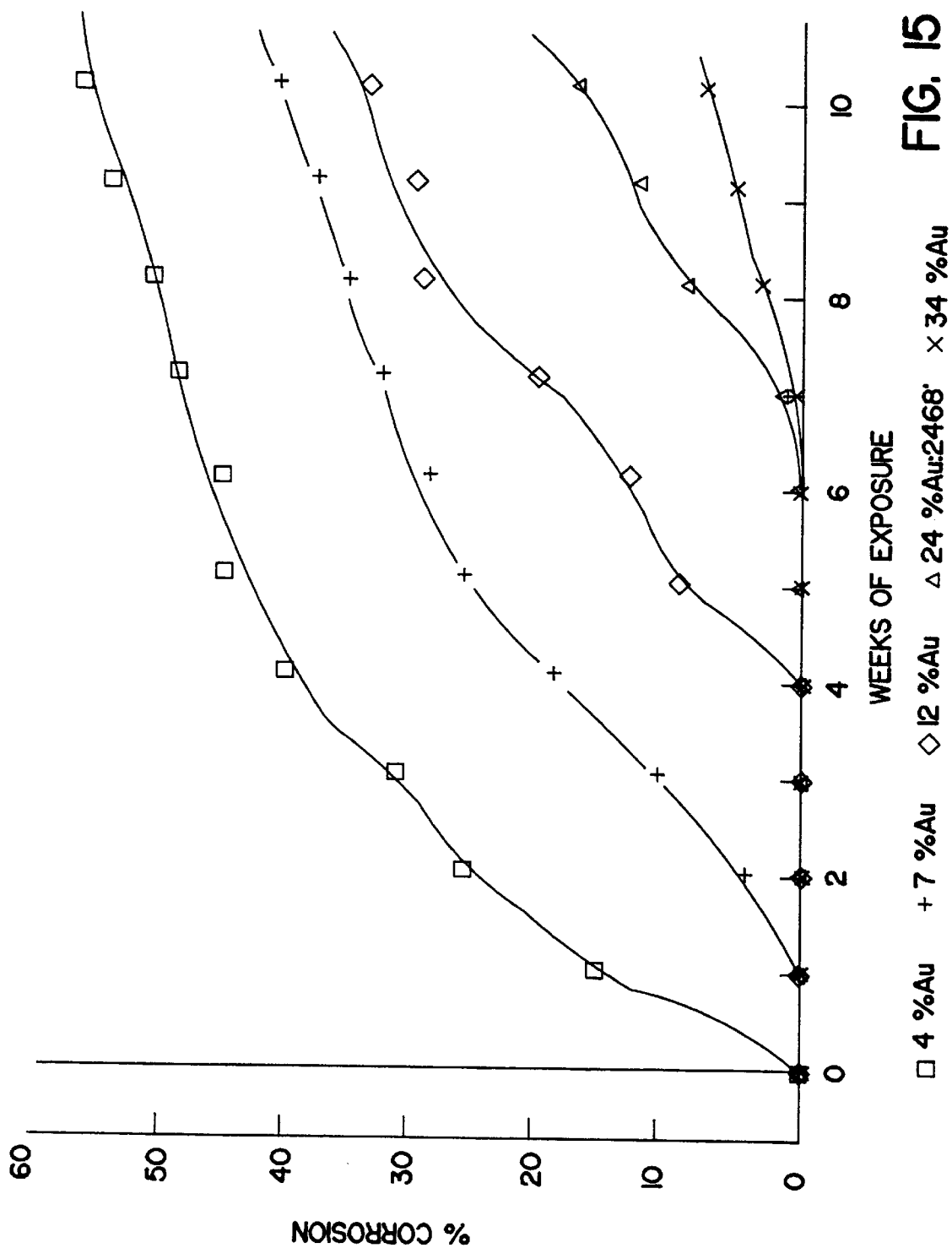
Figure 16:
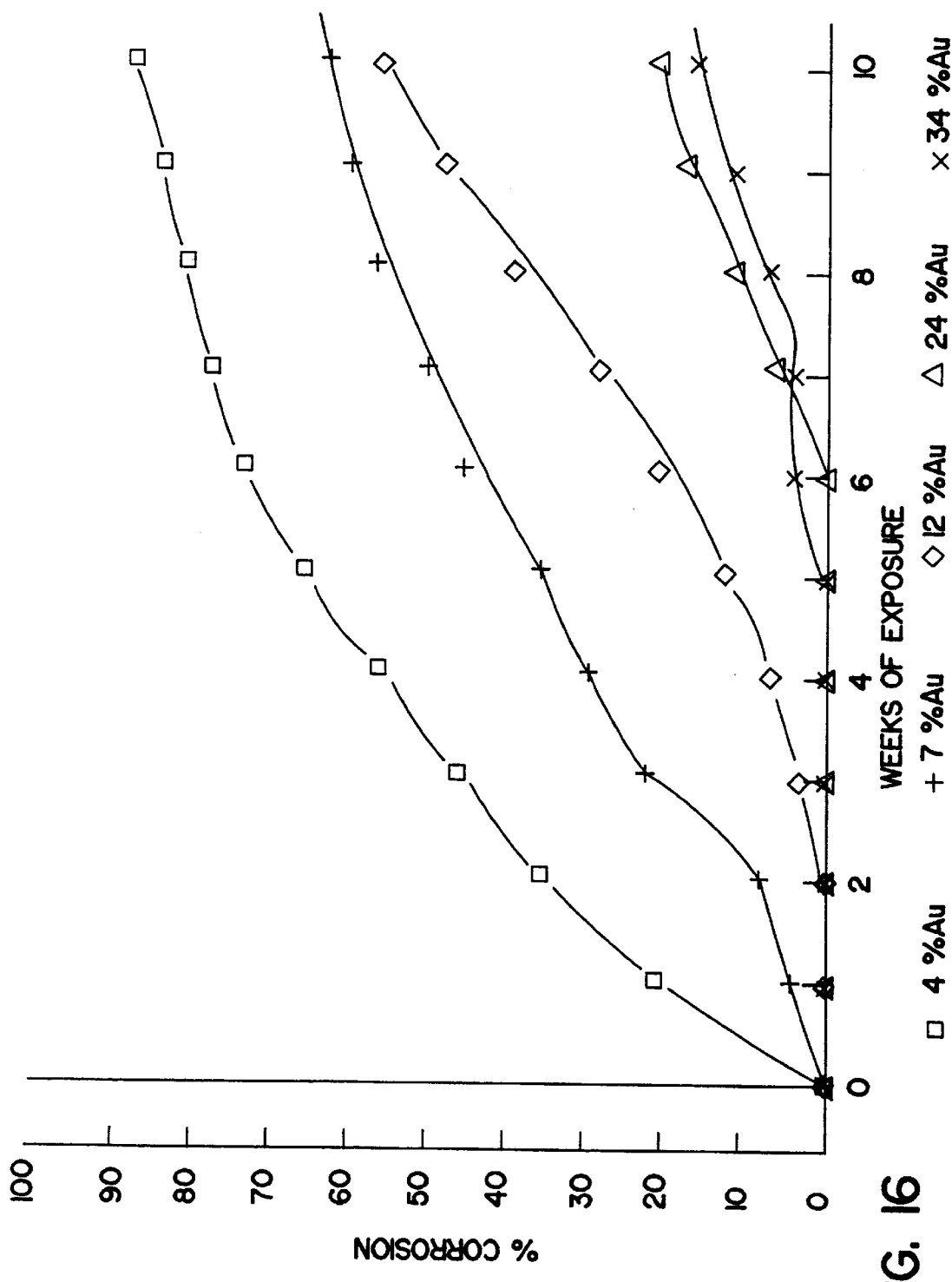

The glass/PVB/film laminates of Example 7 and 8 were subjected to salt fog corrosion testing. The results of the tests of the Example 7 materials are shown in FIG. 15. The tests of the Example 8 materials are shown in FIG. 16. These results consistently showed that the gold cladding protects the silver layers and provides corrosion resistance.

Figure 17:
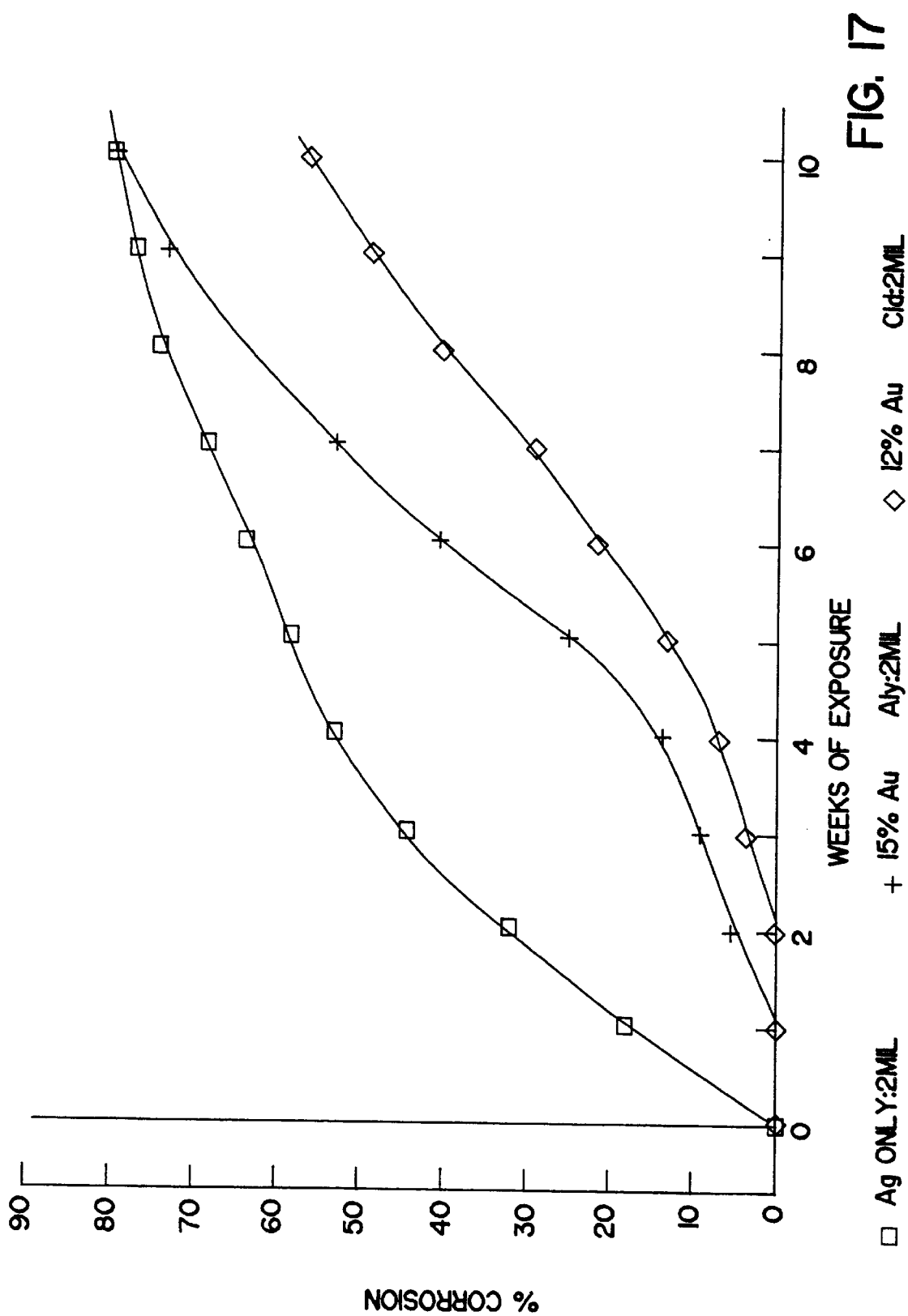
FIG. 17 is a series of graphs comparing the effects of cladding and alloying on delaying corrosion.

In a similar test, three laminated products having three silver layers were prepared in accord with Example 8. One of the materials had no added gold. The second was formed by sputtering a 15% wt. gold-85% silver alloy target. The third was silver with a X16 gold cladding. The clad material contained about 12% gold present as two 3 Å thick layers on both sides of the silver. The materials were tested as shown in FIG. 17. The clad material distinctly outperformed the alloy.

Other Effects of Gold Addition to Silver

Figure 18:
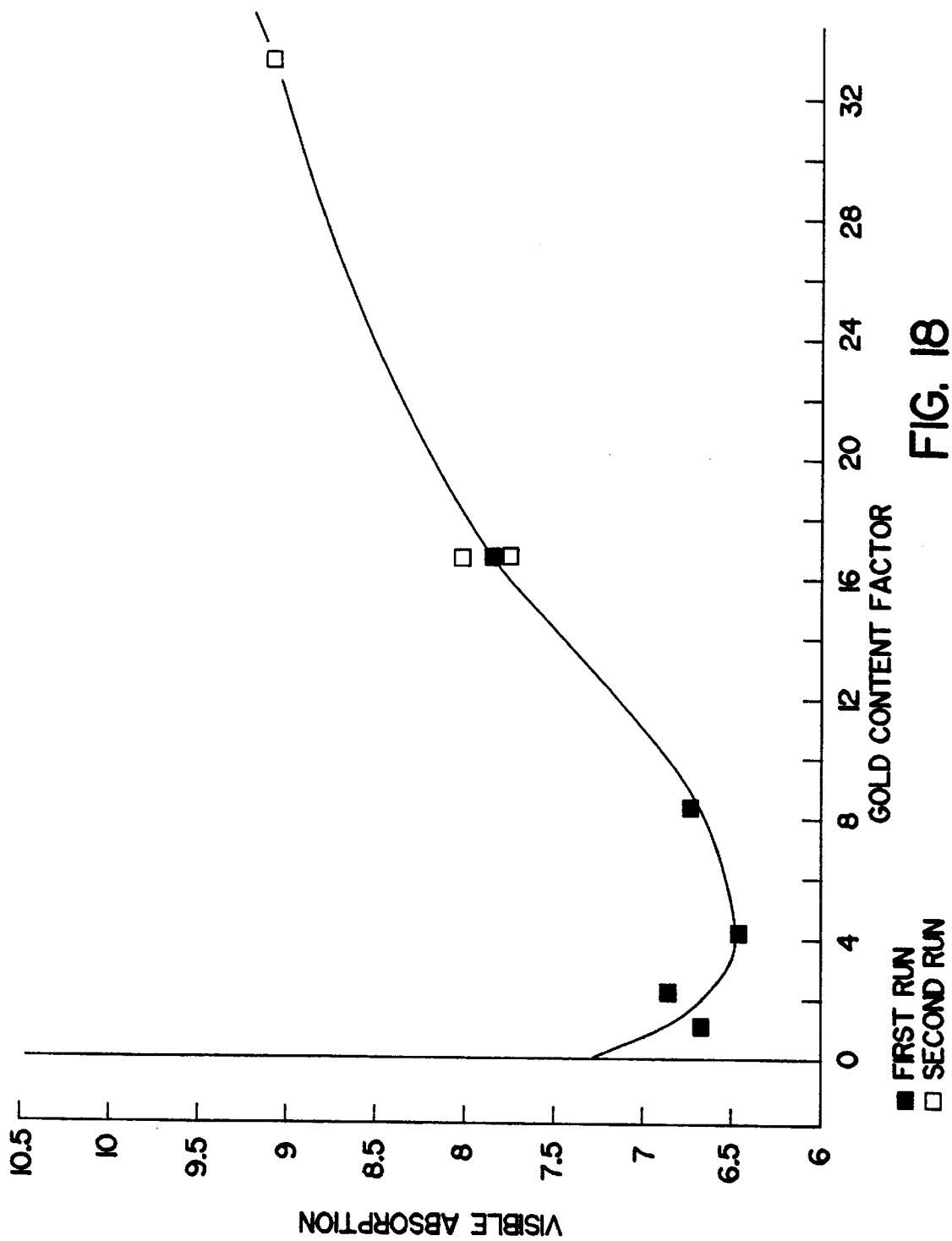
FIG. 18 is a graph illustrating the unexpected finding that gold-cladding the silver layer decreases the visible absorption of glazing materials.

A series of "PET/IO/Au/Ag/Au/IO" films were prepared with various thicknesses of gold. The absorbance of visible light by these films was measured with interesting and unexpected results. As shown in FIG. 18, the absorbance actually dropped as the gold was added at the X1, X2, X4 and even X4 levels.

As shown in FIG. 19, the same surprising effect was noted in sheet resistance.

Figure 20:
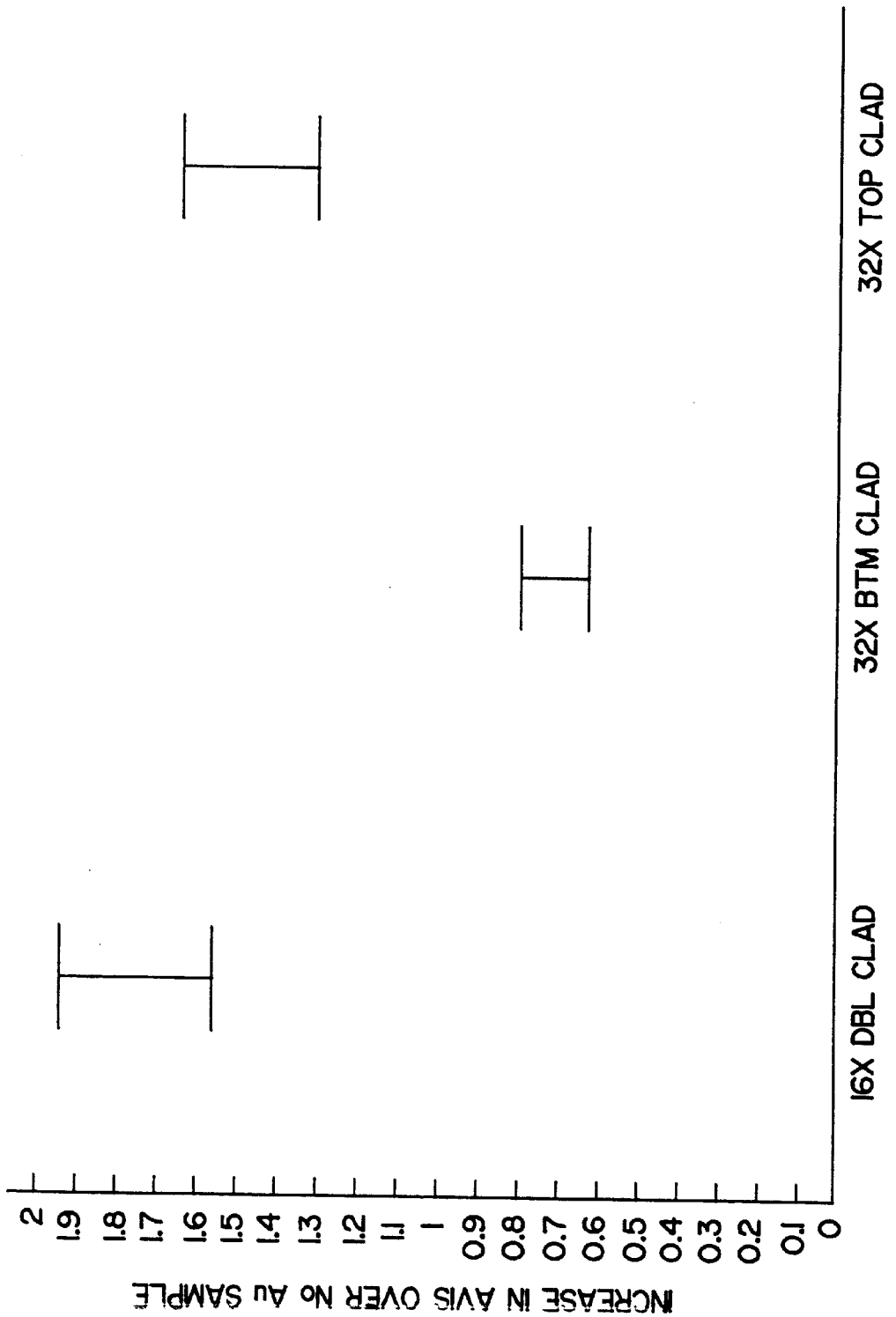
FIG. 20 is a graph illustrating the unexpected advantage of lower relative visible absorption which results from putting the gold cladding under the silver layer instead of on top of it.

In a variation on the visible absorbance measurement, three materials with identical total gold content. One material had all the gold on top of the silver and thus was a "PET/IO/Ag/AuX32/IO" material. One had all the gold beneath the silver layer and thus was a "PET/IO/AuX32/Ag/IO". The third had gold in both locations and thus was a "PET/IO/AuX16/Ag/AuX16/IO". The results showed that when a single layer was employed, it should be placed "beneath" the silver layer. The material with the gold on the bottom gave the best result, that is the smallest increase in absorbance, as shown in FIG. 20.

We claim:

1. A heat wave-reflective or electrically conductive substantially transparent sheet comprising a transparent flexible polyester sheet solid substrate, a transparent first boundary layer of dielectric having an index of refraction greater than 1.75 and a thickness of from about 100 to 1500 Å on said substrate, a transparent gold-clad silver layer having a sputter-deposited 50 Å to 400 Å silver layer consisting of silver with not more than 0.5% by weight of other metals clad on both sides or on its side adjacent to the transparent first boundary layer with a sputter-deposited 0.3 Å to 50 Å layer consisting of gold or an alloy of silver and at least 30% gold on said transparent first boundary layer, and a transparent second boundary layer of dielectric having an index of refraction greater than 1.75 and a thickness of from about 100 to 1500 Å on said gold-clad silver layer.

2. The transparent sheet of claim 1 additionally comprising a second gold-clad silver layer and a spacer layer so as to comprise a transparent flexible polyester sheet solid substrate, a transparent first boundary layer of dielectric having an index of refraction greater than 1.75 and a thickness of from about 100 to 1500 Å on said substrate, a transparent first gold-clad silver layer having consisting essentially of a sputter-deposited 50 Å to 400 Å silver layer consisting of silver with not more than 0.5% by weight of other metals clad on both sides or on its side adjacent to the transparent first boundary layer with a sputter-deposited 0.3 Å to 50 Å layer consisting of gold or an alloy of silver and at least 30% gold on said transparent first boundary layer, a transparent spacer layer of dielectric having an index of refraction greater than 1.75 and a thickness of from about 400 to 2000 Å on said first gold-clad silver layer, a transparent second gold-clad silver layer having a sputter-deposited 50 Å to 400 Å silver layer consisting of silver with not more than 0.5% by weight of other metals clad on both sides or on its side adjacent to the spacer layer with a sputter-deposited 0.3 Å to 50 Å layer consisting of gold or an alloy of silver and at least 30% gold on said spacer layer, and a transparent second boundary layer of dielectric having an index of refraction greater than 1.75 and a thickness of from about 100 to 1500 Å on said second gold-clad silver layer.

3. The transparent sheet of claim 2 additionally comprising a third gold-clad silver layer and a second spacer layer so as to comprise a transparent flexible polyester sheet solid substrate, a transparent first boundary layer of dielectric having an index of refraction greater than 1.75 and a thickness of from about 100 to 1500 Å on said substrate, a transparent first gold-clad silver layer having a sputter-deposited 50 Å to 400 Å silver layer consisting of silver with not more than 0.5% by weight of other metals clad on both sides or on its side adjacent to the transparent first boundary layer with a sputter-deposited 0.3 Å to 50 Å layer consisting of gold or an alloy of silver and at least 30% gold on said transparent first boundary layer, a transparent first spacer layer of dielectric having an index of refraction greater than 1.75 and a thickness of from about 400 to 2000 Å on said first gold-clad silver layer, a transparent second gold-clad silver layer having a sputter-deposited 50 Å to 400 Å silver layer consisting of silver with not more than 0.5% by weight of other metals clad on both sides or on the side adjacent to the first spacer layer with a sputter-deposited 0.3 Å to 50 Å layer consisting of gold or an alloy of silver and at least 30% gold on said first spacer layer, a transparent second spacer layer of dielectric having an index of refraction greater than 1.75 and a thickness of from about 400 to 2000 Å on said second gold-clad silver layer, a transparent third gold-clad silver layer having a sputter-deposited 50 Å to 400 Å silver layer consisting of silver with not more than 0.5% by weight of other metals clad on both sides or on the side adjacent to the second spacer layer with a sputter-deposited 0.3 Å to 50 Å layer consisting of gold or an alloy of silver and at least 30% gold on said second spacer layer, and a transparent second boundary layer of dielectric having an index of refraction greater than 1.75 and a thickness of from about 100 to 1500 Å on said third gold-clad silver layer.

4. The transparent sheet of claim 3 wherein the silver layers are each clad on both sides with a layer consisting of gold or an alloy of silver and at least 30% gold.

5. The transparent sheet of claim 3 wherein one side of each of the silver layers clad with the layer consisting of gold or an alloy of silver and at least 30% gold is the side adjacent to the first boundary layer.

6. The transparent sheet of claim 2 wherein the silver layers are each clad on both sides with a layer consisting of gold or an alloy of silver and at least 30% gold.

7. The transparent sheet of claim 2 wherein one side of each of the silver layers clad with the layer consisting of gold or an alloy of silver and at least 30% gold is the side adjacent to the first boundary layer.

8. The transparent sheet of claim 1 wherein the silver layer is clad on both sides with a layer consisting of gold or an alloy of silver and at least 30% gold.

9. The transparent sheet of claim 1 wherein the one side clad with the layer consisting of gold or an alloy of silver and at least 30% gold is the side adjacent to the first boundary layer.

10. A heat wave-reflective or electrically conductive substantially transparent sheet comprising a transparent solid flexible plastic film substrate, a transparent first boundary layer of dielectric having an index of refraction greater than 1.75 on said substrate, a transparent gold-clad silver layer having a sputter-deposited 50 Å to 400 Å silver layer consisting of silver with not more than 0.5% by weight of other metals clad on one or both sides with a sputter-deposited 0.3 Å to 50 Å layer consisting of gold or an alloy of silver and at least 30% gold on said transparent first boundary layer, and a transparent second boundary layer of dielectric having an index of refraction greater than 1.75 on said gold-clad silver layer.

11. The transparent sheet of claim 10 wherein the substrate is poly(ethyleneterephthalate) film.

12. The transparent sheet of claim 10 wherein the silver layer is clad on both sides with a layer consisting of gold or an alloy of silver and at least 30% gold.

13. The transparent sheet of claim 10 wherein the silver layer is clad on one side with the layer consisting of gold or an alloy of silver and at least 30% gold.

14. The transparent sheet of claim 13 wherein the one side clad with the layer consisting of gold or an alloy of silver and at least 30% gold is the side adjacent to the first boundary layer.

15. The transparent sheet of claim 10 wherein the first boundary layer has a thickness of from about 100 to 1500Å.

16. The transparent sheet of claim 10 wherein the second boundary layer has a thickness of from about 100 to 1500Å.

* * * * *